(12) United States Patent
Behzad et al.

(10) Patent No.: US 6,496,067 B1
(45) Date of Patent: Dec. 17, 2002

(54) CLASS AB VOLTAGE CURRENT CONVERTOR HAVING MULTIPLE TRANSCONDUCTANCE STAGES AND ITS APPLICATION TO POWER AMPLIFIERS

(75) Inventors: Arya Reza Behzad, Poway, CA (US); Li Lin, Mountain View, CA (US)

(73) Assignee: Broadcom, Irvine, CA (US)

( * ) Notice: Subject to any disclaimer, the term of this patent is extended or adjusted under 35 U.S.C. 154(b) by 0 days.

(21) Appl. No.: 10/041,147

(22) Filed: Jan. 7, 2002

(51) Int. Cl.[7] ............................... H03F 3/45; H03F 3/04
(52) U.S. Cl. ........................ 330/261; 330/253; 330/296
(58) Field of Search .................................. 330/253, 261, 330/296

(56) References Cited

U.S. PATENT DOCUMENTS 5,043,675 A * 8/1991 Gilbert ........................ 330/258
5,079,515 A * 1/1992 Tanimoto ..................... 330/256
6,122,497 A * 9/2000 Gilbert ......................... 455/293

* cited by examiner

*Primary Examiner*—Patricia Nguyen
(74) *Attorney, Agent, or Firm*—Timothy W. Markison (57) ABSTRACT

A Class AB voltage-to-current converter includes a primary transconductance stage, secondary transconductance stage, and a biasing circuit. The biasing circuit generates a primary bias voltage that is greater than a generated secondary bias voltage. As such, the primary transconductance stage 12 becomes active before the secondary transconductance stage 14 with respect to the magnitude of a differential input voltage 18, thereby allowing the transconductance of the secondary transconductance stage to be added (or subtracted) from the transconductance of the primary stage to improve the overall transconductance of the Class AB voltage-to-current convert.

18 Claims, 8 Drawing Sheets

FIG. 5
class AB voltage to current converter 10

FIG. 6
primary transconductance

FIG. 7
secondary transconductance

FIG. 8
overall transconductance

FIG. 9
class AB voltage to current converter 40

FIG. 10
class AB voltage to current converter 70

FIG. 11
class AB voltage to current converter 90

FIG. 12
class AB voltage to current converter 100

FIG. 13
linear power amplifier 110

_US 6,496,067 B1_

CLASS AB VOLTAGE CURRENT CONVERTOR HAVING MULTIPLE TRANSCONDUCTANCE STAGES AND ITS APPLICATION TO POWER AMPLIFIERS

TECHNICAL FIELD OF THE INVENTION

This invention relates generally to analog circuitry and more particularly to power amplifiers.

BACKGROUND OF THE INVENTION

Open loop amplifiers are known to be used in a wide variety of high-frequency applications. For instance, an open loop amplifiers may be used as buffers, amplifiers, power amplifier drivers, et cetera and are used in such forms in an almost endless list of electronic devices. For example, open loop amplifiers are readily used in radio devices, televisions, telephones, wireless communication devices, entertainment equipment, et cetera.

When an open loop amplifier is employed as a power amplifier driver, it is typically required to drive heavy loads (e.g., 50 Ohms) with a reasonably small amount of power consumption, perform linearly, and provide a desired level of gain. Often, the linearity of a power amplifier driver is determined by the linearity of its voltage-to-current converter (i.e., the transconductance (gm) stage). Given a fixed amount of current, a differential pair of MOSFET transistors linear performance increases by increasing the amount of its $V_{gs}-V_t$ $(=V_{gt})$. However, this results in lower gain for a given bias current and it is also subject to velocity saturation limits.

Figure 1:
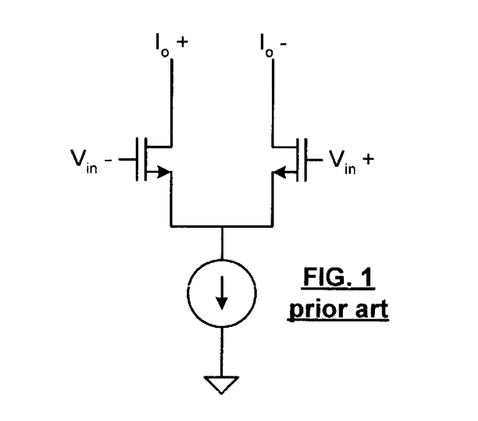
FIG. 1 illustrates a schematic block diagram of a prior art transconductance stage.

Many schemes have been traditionally used to linearize a transconductance stage as compared to that obtained from a standard differential pair, which is shown in FIG. 1. As shown, the transconductance stage includes a pair of transistors operably coupled to receive a differential input voltage and, based on the current provided by the current source, produces a differential output current. However, the linearization of the transconductance stage shown in FIG. 1 is limited.

Figure 2:
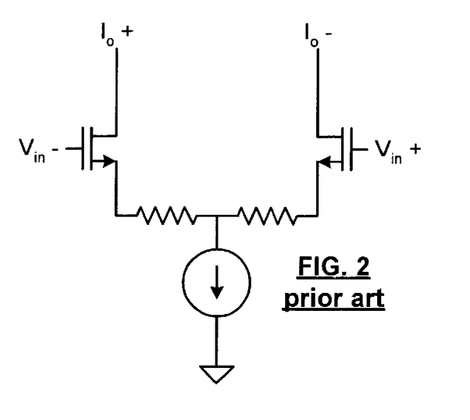
FIG. 2 illustrates a schematic block diagram of an alternate prior art transconductance stage.

FIG. 2 illustrates a transconductance stage that improves linearity, with respect to the transconductance stage of FIG. 1. In this implementation, resistors are added in series with the input transistors. This increases the linear operation range of an amplifier through the local series feedback but at the expense of reduced gain, reduced headroom, and increased noise. One solution to compensate for the reduction in gain is to add additional transconductance stages, which consumes more current and increases the non-linearity and consumes more power.

Figure 3:
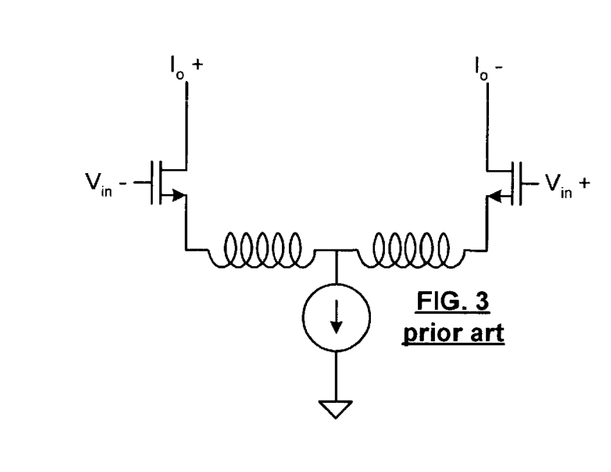
FIG. 3 illustrates a schematic block diagram of another prior art transconductance stage.

FIG. 3 illustrates an alternate transconductance stage that includes inductors in series with the input transistors. This transconductance stage is an improvement over the transconductance stage of FIG. 2 in that it requires less operating voltage and does not contribute extra noise to the output current. However, it still has an effective reduction of the gain and works over a narrow frequency range.

Figure 4:
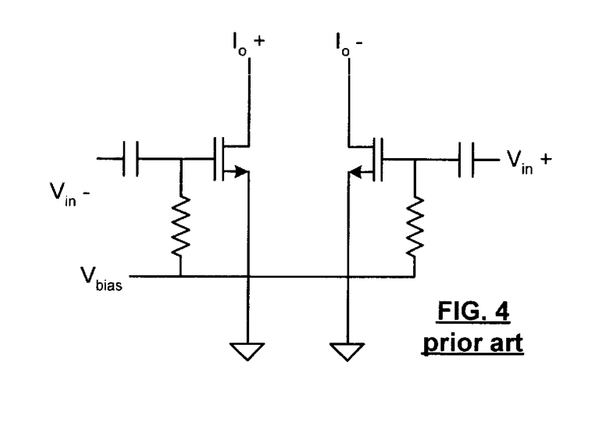
FIG. 4 illustrates a schematic block diagram of yet another prior art transconductance stage.

FIG. 4 illustrates yet another known implementation of a transconductance stage. In this instance, the input transistors are operably coupled to an effective ground wherein the inputs are AC coupled and biased to a particular bias voltage. This implementation results in a fundamentally different large signal transfer function than that of the differential pair amplifiers illustrated in FIGS. 1 through 3. This transfer function is typically more linear in nature than that of the standard differential pair amplifier of FIGS. 1 through 3. Furthermore, this embodiment requires less headroom than that of a standard differential pair and has no degeneration noise penalties. However, this embodiment provides a limited amount of improvement in linearity performance as compared to that of the differential pairs of FIGS. 1 through 3. Such limited linearity in many systems is unacceptable.

Therefore, a need exists for a transconductance stage that operates from low supply voltages, has good noise performance, and has good linearity performance.

DETAILED DESCRIPTION OF A PREFERRED EMBODIMENT

Figure 5:
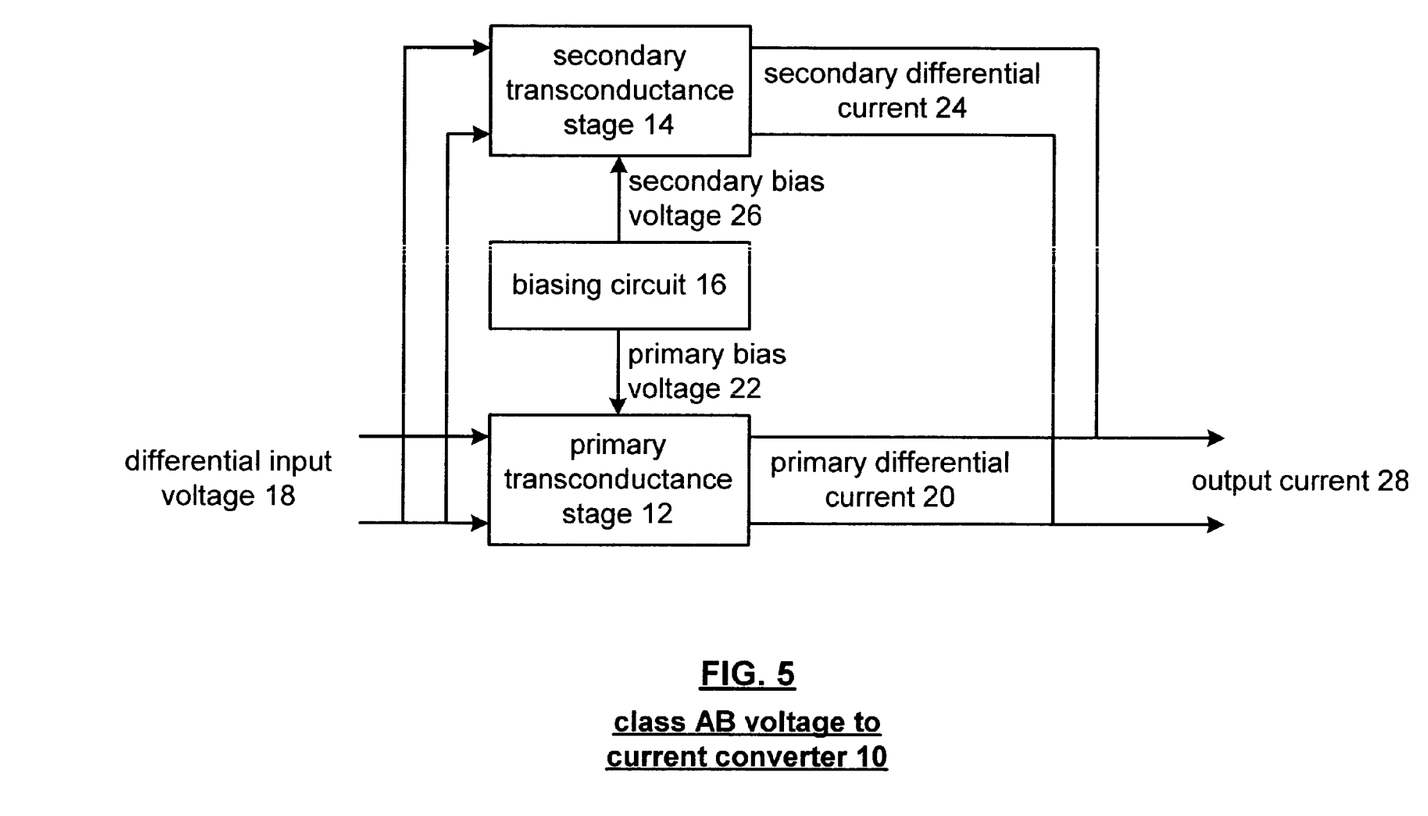
FIG. 5 illustrates a schematic block diagram of a Class AB voltage-to-current converter in accordance with the present invention.

FIG. 5 illustrates a schematic block diagram of a Class AB voltage-to-current converter 10 that includes a primary transconductance stage 12, secondary transconductance stage 14 and a biasing circuit 16. The biasing circuit 16 generates a primary bias voltage 22 and a secondary bias voltage 26. The primary bias voltage 22 is greater than the secondary bias voltage 26 such that the primary transconductance stage 12 becomes active before the secondary transconductance stage 14 with respect to the magnitude of a differential input voltage 18.

In operation, the primary transconductance stage 12 and the secondary transconductance stage 14 are operably coupled to receive a differential input voltage 18. Based on the primary bias voltage 22, the primary transconductance stage 12 converts the differential input voltage 18 into a primary differential current 20. The secondary transconductance stage 14 converts the differential input voltage 18 into a secondary differential current 24 based on the secondary bias voltage 26. The sum of the primary differential current 20 and the secondary differential current 24 produce an output current 28.

The Class AB voltage-to-current converter 10 of FIG. 5 dynamically adds (or subtracts) the secondary transconductance stage 14 from the primary transconductance stage 12 to obtain a wider and more linear transconductance range. As such, the transconductance gain of each stage 12 and 14 are added based on the predefined offset voltages produced by the biasing circuit 16. As the differential input voltage 18 increases in magnitude, the secondary transconductance stage 14 is turned on and broadens the effective transconductance linear range of the converter 10.

As one of average skill in the art will appreciate, the secondary transconductance stage 14 may effectively be subtracted from the primary transconductance stage 12 to compensate for ripple variations in the overall transconductance transfer function of the converter 10. In such an instance, the secondary differential current 24 would be subtracted from the primary differential current 20 to produce the output current 28.

Figure 6:
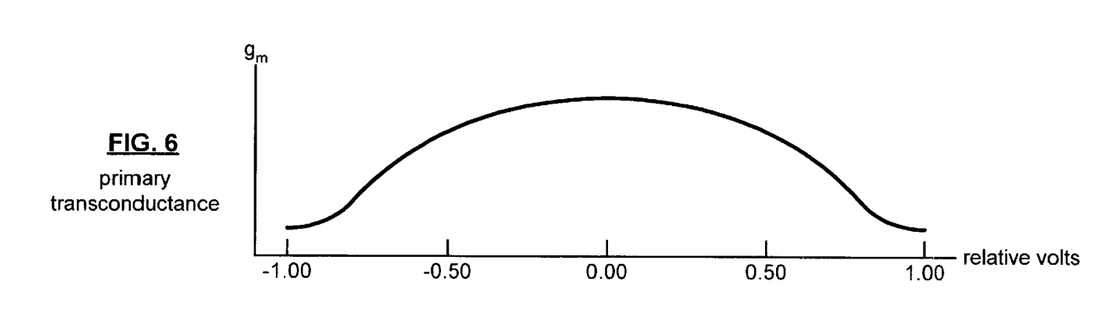
FIGS. 6 through 8 illustrate a graphical representation of the operation of the Class AB voltage-to-current converter of FIG. 5.
Figure 7:
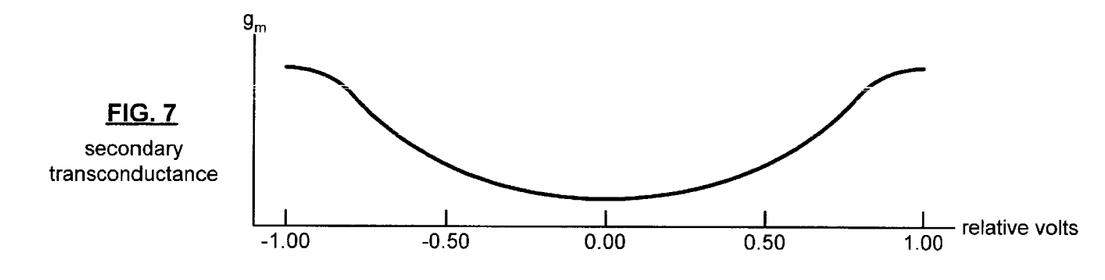
Figure 8:
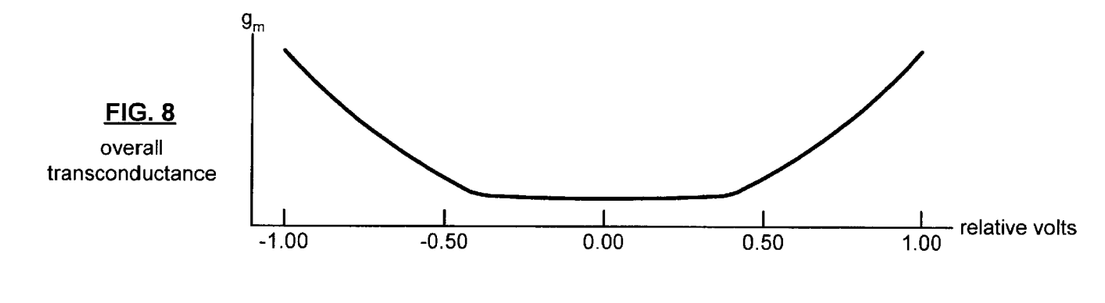

FIGS. 6 through 8 illustrate the DC values of the transconductance gain of the primary transconductance stage, the secondary transconductance stage and the Class AB voltage-to-current converter 10 of the voltage-to-current converter 10 of FIG. 5, as well as the voltageto-current converters illustrated in FIGS. 9 through 12. To obtain the overall transconductance (FIG. 8) of the converter, the transconductance (FIG. 7) of the secondary transconductance stage 14 is added to with the transconductance (FIG. 6) of the primary transconductance stage 12. The resulting overall transconductance has a much flatter transfer function than the transfer function of either of the stages independently. Thus, the overall transconductance behaves much more linearly than the transconductance stages illustrated in FIGS. 1 through 4, especially for large signals.

Figure 9:
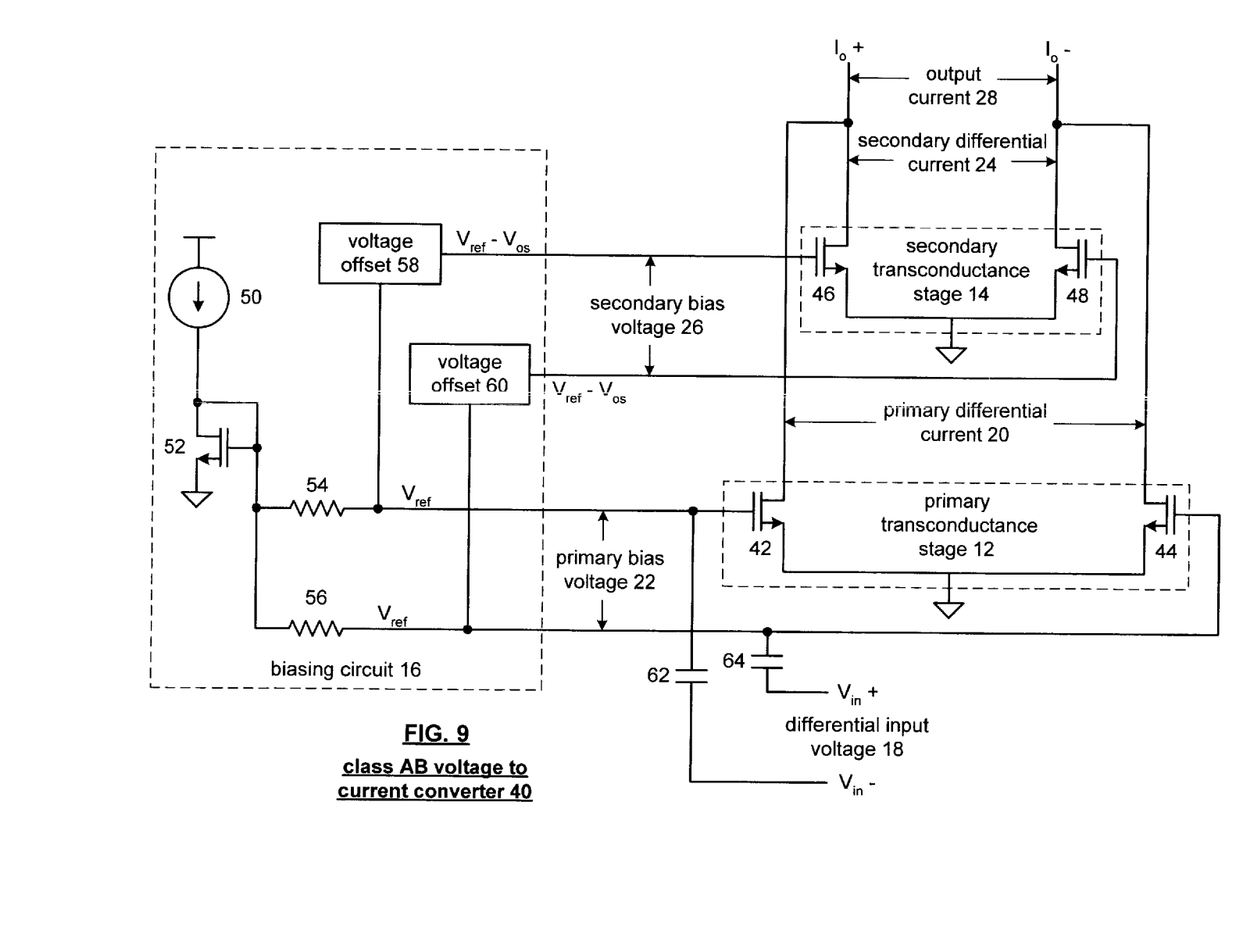
FIG. 9 illustrates a schematic block diagram of an alternate Class AB voltage-to-current converter in accordance with the present invention.

FIG. 9 illustrates a schematic block diagram of a Class AB voltage-to-current converter 40 that includes an embodiment of the biasing circuit 16, an embodiment of the secondary transconductance stage 14 and an embodiment of the primary transconductance stage 12. The biasing circuit 16 includes current source 50 and transistor 52 to produce a reference voltage source ($V_{ref}$). The biasing circuit also includes a resistive pair (resistors 54 and 56) and voltage offset modules 58 and 60. In this configuration, the biasing circuit 16 provides the reference voltage ($V_{ref}$) as the primary bias voltage 22 to the primary transconductance stage 12.

The voltage offset modules 58 and 60 subtract an offset voltage ($V_{os}$) from the reference voltage. The resulting voltage ($V_{ref}-V_{os}$) is provided as the secondary bias voltage 26 to the secondary transconductance stage 14. Such an offset may be created by a diode, a battery, a biased transistor, etc.

The primary transconductance stage 12 includes a $1^{st}$ transistor 42 and a $2^{nd}$ transistor 44. The $1^{st}$ transistor 42 is operably coupled via capacitor 62 to receive one leg (e.g., $V_{in}-$) of the differential input voltage 18. The $2^{nd}$ transistor 44 is operably coupled via capacitor 64 to receive a $2^{nd}$ leg (e.g., $V_{in}+$) of the differential input voltage 18. As configured, the primary transconductance stage 12 produces the primary differential current 20 from the differential input voltage 18 based on the primary bias voltage 22. Accordingly, the primary bias voltage 22 is set to a level that insures that for almost any differential input voltage 18 a primary differential current 20 is produced.

The $2^{nd}$ secondary transconductance stage 14 includes a $1^{st}$ transistor 46 and a $2^{nd}$ transistor 48. The gate voltage of transistors 46 and 48 is based on the secondary bias voltage 26 and the differential input voltage 18. For instance, the gate voltage for one transistor is $V_{ref}-V_{os}$+delta $V_{in}$, while the gate voltage for the other transistor is $V_{ref}-V_{os}$-delta $V_{in}$. When the gate threshold voltage of one of the transistors 46 and 48 is exceeded, the secondary transconductance stage 14 generates the secondary differential current 24.

The output current 28 is the sum of the secondary differential current 24 and the primary differential current 20. Note that when the gate voltage on transistors 46 and 48 have not exceeded their threshold voltage, no secondary differential current 24 is produced. Thus, for relatively low differential input voltages 18, the output current 28 is produced solely by the differential current 20. As the magnitude of the differential input voltage 18 increases, the secondary transconductance stage 14 becomes active and generates the secondary differential current 24 which is added to the primary differential current 20 to produce the resulting output current 28, which improves the overall transconductance and linearity of the converter 40.

Figure 10:
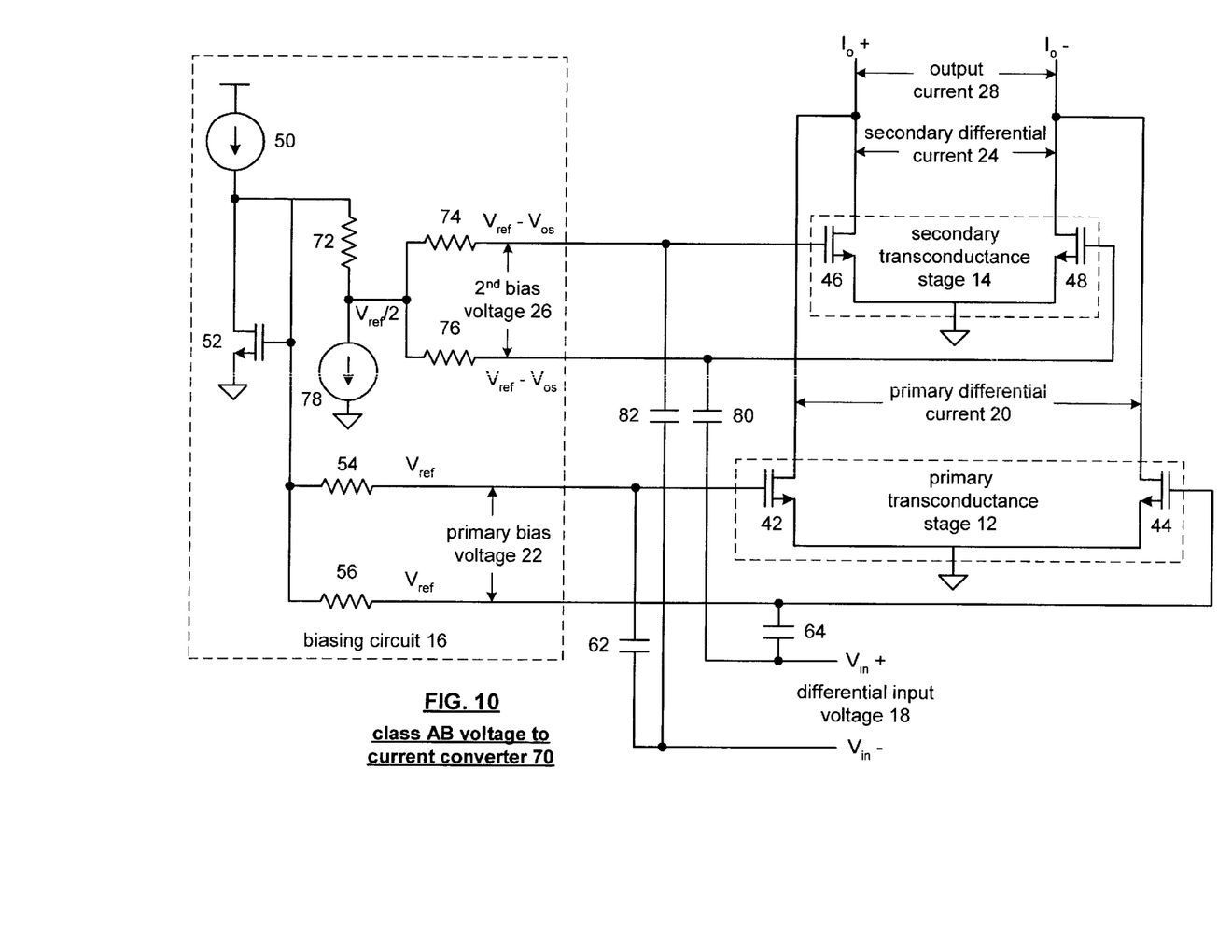
FIG. 10 illustrates a schematic block diagram of another Class AB voltage-to-current converter in accordance with the present invention.

FIG. 10 illustrates a schematic block diagram of a Class AB voltage-to-current converter 70 that includes another embodiment of the biasing circuit 16, an embodiment of the secondary transconductance stage 14, and an embodiment of the primary transconductance stage 12. In this implementation, the biasing circuit 16 produces a $1^{st}$ reference voltage via the current source 50 and transistor 52, and produces a $2^{nd}$ reference voltage via resistor 72 and current source 78. The biasing circuit 16 also includes a $1^{st}$ resistive pair 54 and 56, and a $2^{nd}$ resistive pair 74 and 76.

The biasing circuit 16 provides the $1^{st}$ reference voltage ($V_{ref}$) as the primary bias voltage 22 to the primary transconductance stage 12. The biasing circuit 16 provides the $2^{nd}$ reference voltage to the secondary transconductance stage 14. In this example, the sizing of resistor 72 and current source 78 causes the $2^{nd}$ reference voltage to be 200 mV less than the primary bias voltage 22. Accordingly, the secondary bias voltage 26 is represented as ($V_{ref}-V_{of}$), which equals $V_{ref}$-200 mV.

The primary transconductance stage 12 operates as previously discussed with reference to FIG. 9 to produce the primary differential current 20. The secondary transconductance stage 14 is operably coupled to receive the secondary bias voltage 26 and the differential input voltage 18 via capacitors 80 and 82. Accordingly, the secondary transconductance stage 14 produces the secondary differential current 24 when the gate voltage on transistors 46 and 48 exceed the threshold voltage. This occurs when the differential input voltage 18 increases in magnitude such that the sum of the differential input voltage with the secondary bias voltage 26 exceeds the threshold voltage on transistors 46 and 48.

As one of average skill in the art will appreciate, the transistors used in the secondary transconductance stage 14 and the transistors used in the primary transconductance stage 12 may have the same size. This reduces process, offset, and temperature variation affects in the performance of the converter 70.

Figure 11:
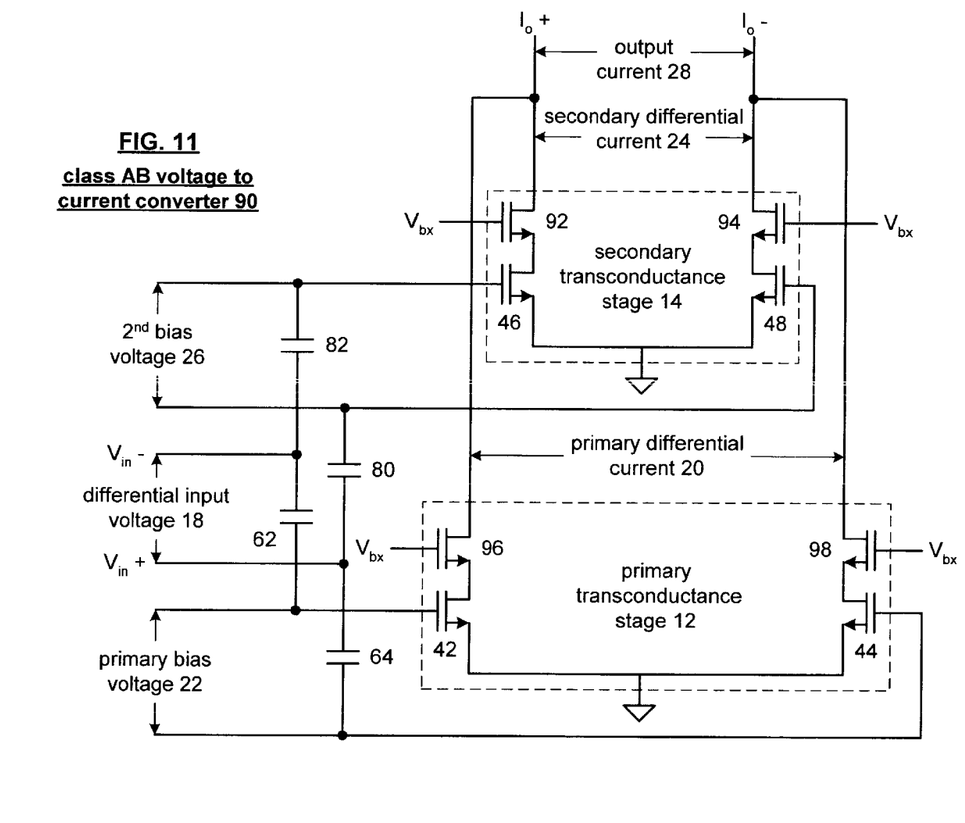
FIG. 11 illustrates a schematic block diagram of yet another Class AB voltage-to-current converter in accordance with the present invention.

FIG. 11 illustrates a schematic block diagram of a Class AB voltage-to-current converter 90 that includes an alternate embodiment of the primary transconductance stage 12, an alternate embodiment of the secondary transconductance stage 14 and the biasing circuit 16 (not shown). The biasing circuit 16 as previously discussed with reference to FIGS. 5, 9 and 10 produce a secondary bias voltage 26 and a primary bias voltage 22. The differential input voltage 18 is operably coupled to the primary transconductance stage 12 via capacitors 62 and 64 and to the secondary transconductance stage 14 via capacitors 80 and 82.

The primary transconductance stage 12 includes a $1^{st}$ cascoded transistor pair 42 and 96 and a $2^{nd}$ cascoded transistor pair 44 and 98. Transistors 96 and 98 are operably coupled to a reference biasing voltage ($V_{bx}$). The inclusion of the cascoded transistors 96 and 98 improve performance in at least some applications by providing better matching between the transistors in the primary transconductance stage 12 and the transistors in the secondary transconductance stage 14. In addition, the cascoded transistors 96 and 98 provide isolation from the secondary transconductance stage 14.

The secondary transconductance stage 14 includes a $1^{st}$ cascoded transistor pair 46 and 92 and a $2^{nd}$ cascoded transistor pair 48 and 94. The cascoded transistors 92 and 94 are operably coupled to the transistor bias voltage ($V_{bx}$). The cascoded transistors 92 and 94 provide better matching of transistors within the secondary transconductance stage 14 and with the primary transconductance stage 12. In addition, the cascoded transistors 92 and 94 provide isolation from the primary transconductance stage 12.

As configured, the primary transconductance stage 12 produces the primary differential current 20 and the secondary transconductance stage 14 produces the secondary differential current 12. The output current 28 is the sum of the primary differential current 20 and the secondary differential current 24. As previously discussed, the secondary transconductance stage 14 does not immediately produce the secondary differential current 24. The secondary differential current 24 is produced when the differential input voltage 18 in combination with the secondary bias voltage 26 exceeds the threshold voltage of transistors 46 and 48.

Figure 12:
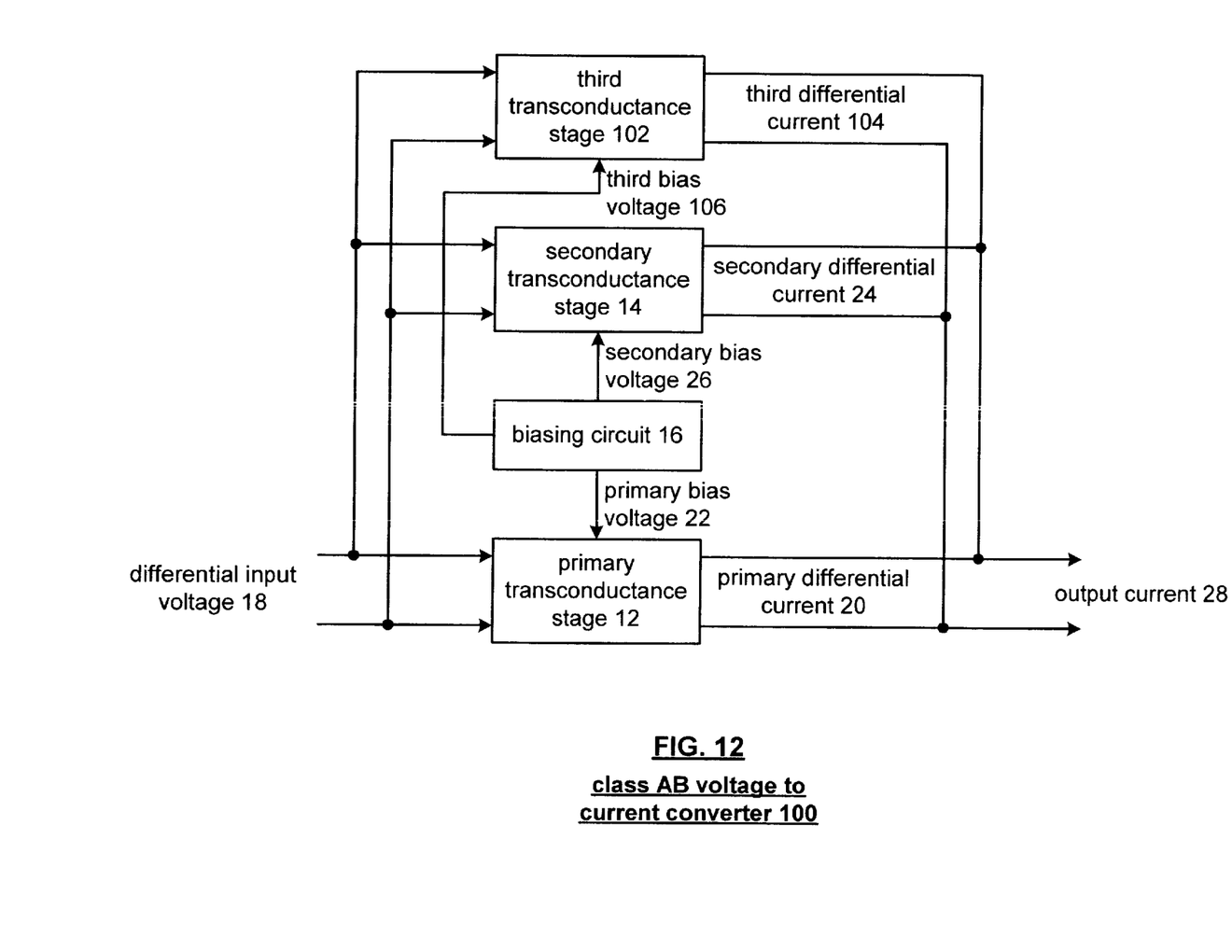
FIG. 12 illustrates a schematic block diagram of a further Class AB voltage-to-current converter in accordance with the present invention.

FIG. 12 illustrates a schematic block diagram of another Class AB voltage-to-current converter 100. The converter 100 includes the primary transconductance stage 12, biasing circuit 16, the secondary transconductance stage 14 and a $3^{rd}$ transconductance stage 102. The primary transconductance stage 12, the biasing circuit 16 and the secondary transconductance stage 14 may be implemented in accordance with any one of the preceding FIGS. 5 and 9 through 11. In addition, the biasing circuit 16 is configured to produce a $3^{rd}$ bias voltage 106. The $3^{rd}$ bias voltage 106 is less than the secondary bias voltage 26.

In operation, the primary transconductance stage 12, the secondary transconductance stage 14 and the $3^{rd}$ transconductance stage 102 are operably coupled to receive the differential input voltage 18. The primary and secondary transconductance stages 12 and 14 produce the primary differential current 20 and the secondary differential current 24, respectively. The $3^{rd}$ transconductance stage 102 based on the $3^{rd}$ bias voltage 106 generates a $3^{rd}$ differential current 104 from the differential input voltage 18. The construct and operation of the $3^{rd}$ transconductance stage may be similar to the secondary transconductance stage illustrated in FIGS. 9 through 11. The only substantive difference between the $3^{rd}$ transconductance stage 102 and the secondary transconductance stage 14 is that the $3^{rd}$ bias voltage 106 is smaller than the secondary bias voltage 26. As such, the secondary transconductance stage 14 produces the secondary differential current 24 for mid-level differential input voltages while the $3^{rd}$ transconductance stage 102 does not produce the $3^{rd}$ differential current 104 until the magnitude of the differential input voltage 18 exceeds the $3^{rd}$ bias voltage 106. Accordingly, the overall transconductance of the converter 100 is the sum of the three transconductance stages and, as such, provides an even greater linear range of operation.

The output current 28 is the sum of the primary differential current 20, the secondary differential current 24 and the $3^{rd}$ differential current 104. As previously discussed, for small magnitude differential input voltages, only the primary differential current 20 is produced thus, the output current 28 is the primary differential current 20. As the magnitude of the differential input current 18 increases, the secondary transconductance stage 14 is enabled thus, producing the secondary differential current 24. At this point, the output current 28 is representative of the sum of the secondary differential current 24 and the primary differential current 20. As the magnitude of the differential input voltage 18 further increases the $3^{rd}$ transconductance stage 102 is enabled thus, producing the $3^{rd}$ differential current 104. At this point, the output current 28 is the sum of the primary, secondary and third differential currents 20, 24 and 104.

As one of average skill in the art will appreciate, the $3^{rd}$ transconductance stage 102 may be operably coupled to subtract the $3^{rd}$ differential current 102 from the primary and secondary differential currents.

Figure 13:
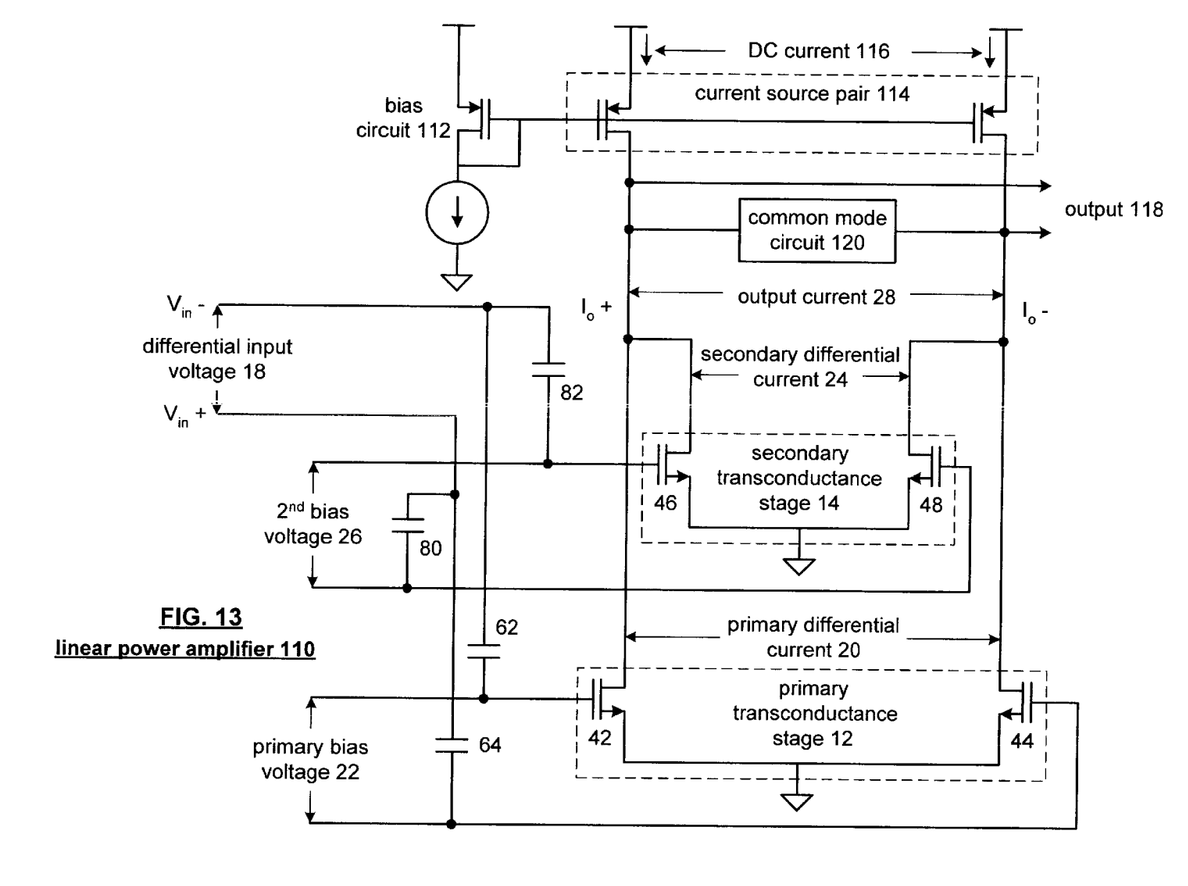
FIG. 13 illustrates a schematic block diagram of a linear power amplifier in accordance with the present invention.

FIG. 13 illustrates a schematic block diagram of a linear power amplifier 110 that includes the primary transconductance stage 12, the secondary transconductance stage 14, the bias circuit 16 (not shown), a common mode circuit 120, a current source pair 114, or inductors, and a bias circuit 112. In this configuration, the bias circuit 16, the primary transconductance stage 12 and the secondary transconductance stage 14 operate in a manner as previously discussed with reference to FIGS. 5, and 9 through 12.

The current source pair 114 generates a DC current 116 based on a bias voltage produced by bias circuit 112. The common mode circuit 120 causes an output voltage 118 to be produced from the output current 28. As such, a highly linear power amplifier 110 is achieved utilizing the secondary transconductance stage 14 in combination with the primary transconductance stage 12. As one of average skill in the art will further appreciate, the power amplifier 110 may further include a $3^{rd}$ transconductance stage, the current source pair 114 may be replaced by a pair of resistors, etc. As one of average skill in the art will further appreciate, the common mode circuit 120 may be a pair of resistors coupled in series to produce a reference voltage with respect to the output current 28, or any other circuit to provide a common mode voltage for output 118.

The preceding discussion has presented a variety of embodiments of a Class AB voltage-to-current converter. Such embodiments, by including one or more transconductance stages, improves the linear performance of a converter, which may be used in operational amplifiers, drivers, buffers, et cetera. As one of average skill in the art will appreciate, other embodiments may be derived from the teachings of the present invention, without deviating from the scope of the claims.

What is claimed is:

1. A class AB voltage to current converter comprises:
   primary transconductance stage operably coupled to produce a primary differential current from a differential input voltage based on a primary bias voltage;
   secondary transconductance stage operably coupled to produce a secondary differential current based on the differential input voltage and a secondary bias voltage, wherein output current of the class AB voltage current converter is a sum of the primary differential current and the secondary differential current; and
   biasing circuit operably coupled to produce the primary bias voltage and the secondary bias voltage, wherein the primary bias voltage is greater than the secondary bias voltage.

2. The class AB voltage to current converter of claim 1, wherein the primary transconductance stage further comprises:
- first transistor operably coupled to receive a combination of a first leg of the differential input voltage and the primary bias voltage; and
- second transistor operably coupled to receive a combination of a second leg of the differential input voltage and the primary bias voltage, wherein the second transistor is operably coupled to the first transistor such that the first transistor produces a first leg of the primary differential current and the second transistor produces a second leg of the primary differential current.

3. The class AB voltage to current converter of claim 1, wherein the secondary transconductance stage further comprises:
- first transistor operably coupled to receive a combination of a first leg of the differential input voltage and the secondary bias voltage; and
- second transistor operably coupled to receive a combination of a second leg of the differential input voltage and the secondary bias voltage, wherein the second transistor is operably coupled to the first transistor such that the first transistor produces a first leg of the secondary differential current and the second transistor produces a second leg of the secondary differential current.

4. The class AB voltage to current converter of claim 1, wherein the biasing circuit further comprises:
- reference voltage source operably coupled to produce a reference voltage;
- resistive pair operable to couple the reference voltage to the primary transconductance stage as the primary bias voltage; and
- voltage offset module operably coupled to the resistive pair, wherein the voltage offset module produce the secondary bias voltage based on the primary bias voltage.

5. The class AB voltage to current converter of claim 1, wherein the biasing circuit further comprises:
- first reference voltage source operably coupled to produce the primary bias voltage;
- second reference voltage source operably coupled to produce the secondary bias voltage;
- first resistive pair operably coupled to provide the primary bias voltage to the primary transconductance stage; and
- second resistive pair operably coupled to provide the secondary bias voltage to the secondary transconductance stage.

6. The class AB voltage to current converter of claim 1 further comprises:
- third transconductance stage operably coupled to produce a third differential current based on the differential input voltage and a third bias voltage, wherein output current of the class AB voltage current converter is the sum of the primary differential current, the secondary differential current, and the third differential current, wherein the biasing circuit produces the third bias voltage, wherein the secondary bias voltage is greater than the third bias voltage.

7. The class AB voltage to current converter of claim 1, wherein the primary transconductance stage further comprises:
- first cascoded transistor pair operably coupled to receive a combination of a first leg of the differential input voltage and the primary bias voltage; and
- second cascoded transistor pair operably coupled to receive a combination of a second leg of the differential input voltage and the primary bias voltage, wherein the second cascoded transistor pair is operably coupled to the first cascoded transistor pair such that the first cascoded transistor pair produces a first leg of the primary differential current and the second cascoded transistor pair produces a second leg of the primary differential current.

8. The class AB voltage to current converter of claim 1, wherein the secondary transconductance stage further comprises:
- first cascoded transistor pair operably coupled to receive a combination of a first leg of the differential input voltage and the secondary bias voltage; and
- second cascoded transistor pair operably coupled to receive a combination of a second leg of the differential input voltage and the secondary bias voltage, wherein the second cascoded transistor pair is operably coupled to the first cascoded transistor pair such that the first cascoded transistor pair produces a first leg of the secondary differential current and the second cascoded transistor pair produces a second leg of the secondary differential current.

9. A linear power amplifier comprises:
- primary transconductance stage operably coupled to produce a primary differential current from a differential input voltage based on a primary bias voltage;
- secondary transconductance stage operably coupled to produce a secondary differential current based on the differential input voltage and a secondary bias voltage;
- biasing circuit operably coupled to produce the primary bias voltage and the secondary bias voltage, wherein the primary bias voltage is greater than the secondary bias voltage; and
- output section operably coupled to the primary transconductance stage and the secondary transconductance stage, wherein the output section sums the primary differential current and the secondary differential current to produce a differential output.

10. The linear power amplifier of claim 9, wherein the output section further comprises:
- current source pair operably coupled to provide DC current to the primary and secondary transconductance stages;
- common mode circuit operably coupled to provide a common mode voltage based on a common mode reference; and
- resistor section operably coupled to the primary and secondary transconductance stages and to the current source pair to produce the common mode reference and to produce a voltage differential output.

11. The linear power amplifier of claim 9, wherein the output section further comprises:
- resistor section operably coupled to convert current of the differential output into a voltage of the differential output.

12. The linear power amplifier of claim 9, wherein the primary transconductance stage further comprises:
- first transistor operably coupled to receive a combination of a first leg of the differential input voltage and the primary bias voltage; and
- second transistor operably coupled to receive a combination of a second leg of the differential input voltage and the primary bias voltage, wherein the second transistor is operably coupled to the first transistor such that the first transistor produces a first leg of the primary differential current and the second transistor produces a second leg of the primary differential current.

13. The linear power amplifier of claim 9, wherein the secondary transconductance stage further comprises:

first transistor operably coupled to receive a combination of a first leg of the differential input voltage and the secondary bias voltage; and second transistor operably coupled to receive a combination of a second leg of the differential input voltage and the secondary bias voltage, wherein the second transistor is operably coupled to the first transistor such that the first transistor produces a first leg of the secondary differential current and the second transistor produces a second leg of the secondary differential current.

14. The linear power amplifier of claim 9, wherein the biasing circuit further comprises:

reference voltage source operably coupled to produce a reference voltage;

resistive pair operable to couple the reference voltage to the primary transconductance stage as the primary bias voltage; and voltage offset module operably coupled to the resistive pair, wherein the voltage offset module produce the secondary bias voltage based on the primary bias voltage.

15. The linear power amplifier of claim 9, wherein the biasing circuit further comprises:

first reference voltage source operably coupled to produce the primary bias voltage;

second reference voltage source operably coupled to produce the secondary bias voltage;

first resistive pair operably coupled to provide the primary bias voltage to the primary transconductance stage; and second resistive pair operably coupled to provide the secondary bias voltage to the secondary transconductance stage.

16. The linear power amplifier of claim 9 further comprises:

third transconductance stage operably coupled to produce a third differential current based on the differential input voltage and a third bias voltage, wherein output current of the class AB voltage current converter is the sum of the primary differential current, the secondary differential current, and the third differential current, wherein the biasing circuit produces the third bias voltage, wherein the secondary bias voltage is greater than the third bias voltage.

17. The linear power amplifier of claim 9, wherein the primary transconductance stage further comprises:

first cascoded transistor pair operably coupled to receive a combination of a first leg of the differential input voltage and the primary bias voltage; and second cascoded transistor pair operably coupled to receive a combination of a second leg of the differential input voltage and the primary bias voltage, wherein the second cascoded transistor pair is operably coupled to the first cascoded transistor pair such that the first cascoded transistor pair produces a first leg of the primary differential current and the second cascoded transistor pair produces a second leg of the primary differential current.

18. The linear power amplifier of claim 9, wherein the secondary transconductance stage further comprises:

first cascoded transistor pair operably coupled to receive a combination of a first leg of the differential input voltage and the secondary bias voltage; and second cascoded transistor pair operably coupled to receive a combination of a second leg of the differential input voltage and the secondary bias voltage, wherein the second cascoded transistor pair is operably coupled to the first cascoded transistor pair such that the first cascoded transistor pair produces a first leg of the secondary differential current and the second cascoded transistor pair produces a second leg of the secondary differential current.

* * * * *